United States Patent
Miwa et al.

(10) Patent No.: US 10,468,390 B2
(45) Date of Patent: Nov. 5, 2019

(54) LIGHT EMITTING DEVICE AND METHOD OF MANUFACTURING THE SAME

(71) Applicant: TOYODA GOSEI CO., LTD., Kiyosu-shi (JP)

(72) Inventors: Tomohiro Miwa, Kiyosu (JP); Daisuke Kato, Kiyosu (JP); Shigeo Takeda, Kiyosu (JP); Shota Shimonishi, Kiyosu (JP); Hideaki Kato, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 15/648,815

(22) Filed: Jul. 13, 2017

(65) Prior Publication Data

US 2018/0090470 A1 Mar. 29, 2018

(30) Foreign Application Priority Data

Sep. 29, 2016 (JP) ................... 2016-191474

(51) Int. Cl.
| | |
|---|---|
| *H01L 25/07* | (2006.01) |
| *H01L 33/50* | (2010.01) |
| *H01L 33/54* | (2010.01) |
| *H01L 33/62* | (2010.01) |
| *H01L 25/075* | (2006.01) |

(52) U.S. Cl.
CPC ........ *H01L 25/0753* (2013.01); *H01L 33/507* (2013.01); *H01L 33/504* (2013.01); *H01L 33/505* (2013.01); *H01L 33/54* (2013.01); *H01L 33/62* (2013.01); *H01L 2933/005* (2013.01); *H01L 2933/0041* (2013.01)

(58) Field of Classification Search
CPC ... H01L 25/07; H01L 25/0753; H01L 25/075; H01L 33/50; H01L 33/54; H01L 33/62
See application file for complete search history.

(56) References Cited

U.S. PATENT DOCUMENTS

| | | | | |
|---|---|---|---|---|
| 2004/0129945 A1* | 7/2004 | Uemura | ............... | H01L 33/507 257/98 |
| 2008/0231162 A1* | 9/2008 | Kurihara | ............... | F21V 14/08 313/487 |
| 2008/0290351 A1* | 11/2008 | Ajiki | ................. | H01L 25/0753 257/88 |

(Continued)

FOREIGN PATENT DOCUMENTS

| | | |
|---|---|---|
| JP | 2005-109434 A | 4/2005 |
| JP | 2012-199218 A | 10/2012 |

(Continued)

OTHER PUBLICATIONS

Japanese Office Action dated Sep. 10, 2019, in Japanese Patent Application No. 2016-191474, with an English translation.

*Primary Examiner* — Fazli Erdem
(74) *Attorney, Agent, or Firm* — McGinn I.P. Law Group, PLLC.

(57) ABSTRACT

A light emitting device includes a substrate, a plurality of light emitting elements disposed on the substrate, a transparent resin embedded in a space between the plurality of light emitting elements, and a phosphor containing resin layer formed on the plurality of light emitting elements and the transparent resin. The transparent resin includes no phosphor.

18 Claims, 4 Drawing Sheets

(56) References Cited

U.S. PATENT DOCUMENTS

| | | | |
|---|---|---|---|
| 2010/0053034 A1* | 3/2010 | Oyaizu | G02B 5/201 345/32 |
| 2012/0091480 A1* | 4/2012 | Aoki | H01L 25/0753 257/88 |
| 2012/0091489 A1* | 4/2012 | Aoki | F21K 9/00 257/98 |
| 2013/0141013 A1 | 6/2013 | Kodama et al. | |
| 2013/0187540 A1* | 7/2013 | Tischler | H01L 33/50 313/512 |
| 2013/0249407 A1* | 9/2013 | Kashiwagi | H05B 33/0866 315/151 |
| 2013/0249411 A1* | 9/2013 | Takahashi | H05B 33/04 315/158 |
| 2014/0118988 A1* | 5/2014 | Aoki | G02B 27/283 362/19 |
| 2014/0191258 A1 | 7/2014 | Akimoto et al. | |
| 2015/0171281 A1* | 6/2015 | Nakabayashi | H01L 33/486 257/98 |
| 2015/0204494 A1* | 7/2015 | Wada | H01L 25/0753 313/498 |
| 2015/0207045 A1* | 7/2015 | Wada | H01L 33/505 257/88 |
| 2016/0041430 A1* | 2/2016 | Lee | G02F 1/133617 349/96 |
| 2016/0079487 A1* | 3/2016 | Kuroki | H01L 33/486 257/98 |
| 2016/0284666 A1* | 9/2016 | Lee | H01L 33/60 |
| 2017/0213947 A1* | 7/2017 | Miwa | H01L 33/642 |
| 2018/0090470 A1* | 3/2018 | Miwa | H01L 25/0753 |
| 2018/0090646 A1* | 3/2018 | Kato | H01L 33/08 |

FOREIGN PATENT DOCUMENTS

| | | |
|---|---|---|
| JP | 2013-65726 A | 4/2013 |
| JP | 5178623 B2 | 4/2013 |
| JP | 2013-098458 A | 5/2013 |
| JP | 2014-229676 A | 12/2014 |
| JP | 2015-138838 A | 7/2015 |
| JP | 5895597 B2 | 3/2016 |
| JP | 2017112295 * | 6/2017 |

\* cited by examiner

LIGHT EMITTING DEVICE AND METHOD OF MANUFACTURING THE SAME

The present application is based on Japanese patent application No. 2016-191474 filed on Sep. 29, 2016, the entire contents of which are incorporated herein by reference.

BACKGROUND OF THE INVENTION

1. Field of the Invention

This invention relates to a light emitting device and a method of manufacturing the light emitting device.

2. Description of the Related Art

A light emitting device is known wherein plural light emitting elements are densely disposed and covered by a first sealing member and a second sealing member, which include different phosphors, and wherein the first sealing member and the second sealing member are disposed in the form of a checkered pattern (see e.g. JP-B-5895597).

JP-B-5895597 states that the light emitting device can reduce color unevenness in light irradiation image caused by rotating an emission region at a center thereof by using a two-dimensional optical system such as a lens and a reflector.

SUMMARY OF THE INVENTION

The light emitting device disclosed by JP-B-5895597 is constructed such that the first sealing member is embedded in a space between the light emitting elements. Light that enters into the embedded first sealing member is emitted outside after being repeatedly reflected in the embedded first sealing member.

Thus, an optical path in the embedded first sealing member is longer than an optical path in the first sealing member or the second sealing member on the light emitting element. As a result, the amount of fluorescence emitted from the space between the light emitting elements may increase relatively so as to cause lattice-shaped color unevenness. Moreover, this problem may be significant according as the space between the light emitting elements is reduced.

It is an object of the invention to provide a light emitting device that allows a reduction in color unevenness even if plural light emitting elements is densely disposed, and a method of manufacturing a light emitting device.

According to embodiments of the invention, a light emitting device and a method of manufacturing a light emitting device defined by [1] to [5] and [6] to [10] below respectively are provided.

[1] A light emitting device, comprising:
a substrate;
a plurality of light emitting elements disposed on the substrate;
a transparent resin embedded in a space between the plurality of light emitting elements; and
a phosphor containing resin layer formed on the plurality of light emitting elements and the transparent resin,
wherein the transparent resin includes no phosphor.

[2] The light emitting device according to [1], wherein the phosphor containing resin layer comprises a plurality of regions different in fluorescent color.

[3] The light emitting device according to [2], wherein the phosphor containing resin layer comprises a first region and a second region different in fluorescent color, and
wherein the first region and the second region are distributed in a form of a checkered pattern.

[4] The light emitting device according to [2] or [3], wherein a border of the plural regions of the phosphor containing resin layer is located on the transparent resin.

[5] The light emitting device according to [4], wherein a top position of the transparent resin is higher than a top surface of the plurality of light emitting elements.

[6] A method of manufacturing a light emitting device, comprising:
embedding a transparent resin in a space between a plurality of light emitting elements disposed on a substrate; and
forming a phosphor containing resin layer on the plurality of light emitting elements and the transparent resin,
wherein the transparent resin includes no phosphor.

[7] The method according to [6], wherein the phosphor containing resin layer comprises a plural regions different in fluorescent color.

[8] The method according to [7], wherein the phosphor containing resin layer is formed such that a border of the plural regions different in fluorescent color locates on the transparent resin.

[9] The method according to [8], wherein the transparent resin is formed such that a top position of the transparent resin is higher than a top surface of the plurality of light emitting elements.

[10] The method according to any one of [6] to [9], wherein the transparent resin and the phosphor containing resin layer are formed by screen printing.

Effects of the Invention

According to an embodiment of the invention, a light emitting device can be provided that allows a reduction in color unevenness even if plural light emitting elements is densely disposed, and a method of manufacturing a light emitting device.

BRIEF DESCRIPTION OF THE DRAWINGS

Next, the present invention will be explained in conjunction with appended drawings, wherein.

DETAILED DESCRIPTION OF THE
PREFERRED EMBODIMENTS

Embodiment

Configuration of Light Emitting Element

Figure 1A:
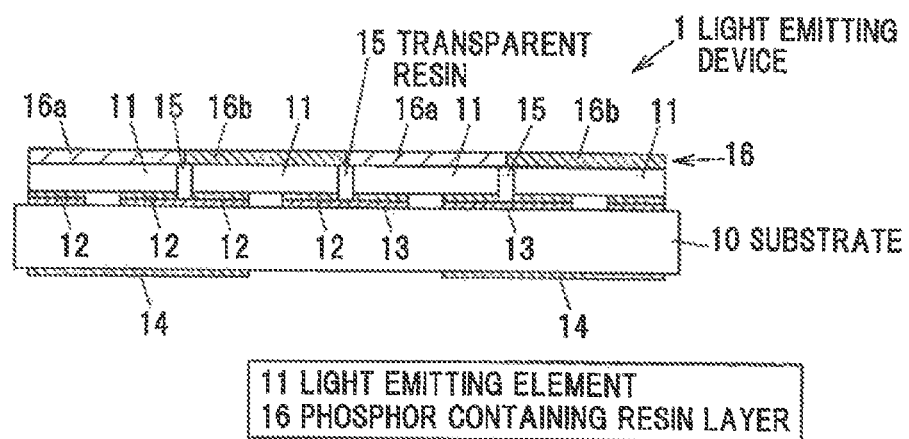
FIG. 1A is a longitudinal sectional view showing a light emitting device according to the embodiment.
Figure 1B:
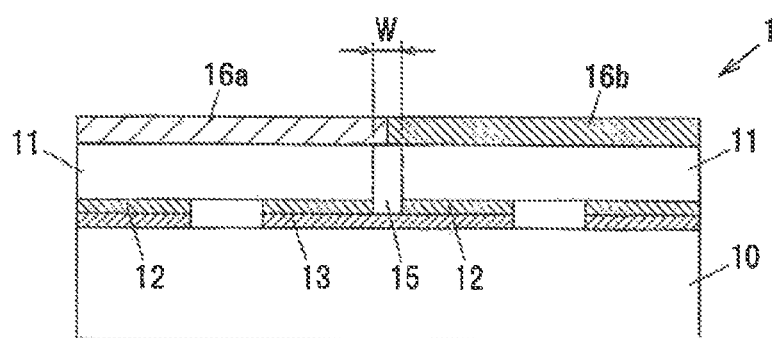
FIG. 1B is a partial enlarged view showing the light emitting device in FIG. 1A.

FIG. 1A is a longitudinal sectional view showing a light emitting device 1 according to the embodiment. FIG. 1B is a partial enlarged view showing the light emitting device in FIG. 1A.

The light emitting device 1 is provided with a substrate 10, a plurality of light emitting elements 11 disposed on the substrate 10, a transparent resin 15 embedded in a space between the plurality of light emitting elements 11, a phosphor containing resin layer 16 formed on the plurality of light emitting elements 11 and the transparent resin 15.

For example, the substrate 10 is a ceramic substrate such as $Al_2O_3$ substrate and AlN substrate, a metallic substrate such as Al substrate and Cu substrate of which an insulating film cover a surface, and a glass epoxy substrate, which have wiring 13 made of Cu etc. on a front surface and a pad electrode 14 made of Cu etc. on a back surface. The wiring 13 and the pad electrode 14 are electrically connected through a viahole etc. which pierces the substrate 10 in the thickness direction.

For example, the light emitting element 11 is a light emitting diode chip or a laser diode chip, and provided with a transparent element substrate and a multilayer crystal including an emission layer. The light emitting element 11 is a face-down type such as a flip-chip type.

The electrode 12 of the light emitting element 11 is connected to the wiring 13 on the front surface of the substrate 10. Power is supplied to the electrode 12 from the exterior through the pad electrode 14 and the wiring 13.

Although a layout and a number of the plurality of light emitting elements 11 are not limited, the plurality of light emitting elements 11 is disposed with high density. In this case, "High density" means that, for example, a width of space W between the light emitting elements 11 (the space between the adjacent light emitting elements 11) is not more than 200 µm.

Color unevenness can reduce in the case that the light emitting device 1 has a plural types of emission regions different in light emission colors by disposing the plurality of light emitting elements 11 with the high density. The case that "the light emitting device 1 has the plural types of emission regions different in the light emission colors" means that, for example, "the phosphor containing resin layer 16 has the plural types of regions different in fluorescent colors" or "the plurality of light emitting elements 11 comprises a plural types of light emitting elements different in light emission colors". Furthermore, a light intensity control function can be added to the light emitting device 1 by individually supplying power to each type of light emitting element when the plurality of light emitting elements 11 comprises the plural types of light emitting elements different in the light emission colors.

The transparent resin 15 is the resin such as a silicon resin and an epoxy resin, and fails to include the phosphor.

As described above, since an optical path in the transparent resin 15 where the light enters becomes long if the transparent resin 15 includes the phosphor, an amount of fluorescence emitted from the transparent resin 15 is larger than an amount of fluorescence emitted from the phosphor containing resin layer 16. Thus, the color unevenness causes in the light emission of the light emitting device 1. Therefore, the color unevenness can reduce by the transparent resin 15 failing to include the phosphor.

The color unevenness caused if the transparent resin 15 includes the phosphor causes remarkably as the width of the space W between the light emitting elements becomes narrower. Therefore, reducing the color unevenness caused by the transparent resin 15 failing to include the phosphor causes more effectively if the width of the space W between the light emitting elements is particularly small, for example, not more than 100 µm. Moreover, when the width W is not more than 50 µm, the effect causes more effectively.

Furthermore, absorbing in transmitting the light through the transparent resin is smaller than absorbing in reflecting the light to a white resin. Therefore, reducing an amount of light caused by absorbing can be controlled compared to apply the white resin instead of the transparent resin 15.

The phosphor containing resin layer 16 comprises the transparent resin such as the silicon resin and the epoxy resin in which phosphor particles are separated. It is preferable that a refractive index of the transparent resin 15 is smaller than a refractive index of an element substrate of the light emitting element 11, and a refractive index of the phosphor containing resin layer 16 is smaller than the refractive index of the transparent resin 15 so as to improve light extraction efficiency.

The phosphor containing resin layer 16 may have the plural types of regions different in the fluorescent colors, that is, the plural types of regions including different phosphors. In this case, light emission color scattering of the light emitting device 1 can be controlled by forming the phosphor containing resin layer 16 so as not to locate a border of the plural types of regions different in the fluorescent colors just above the light emitting element 11, that is, so as to locate the border of the plural types of regions on the transparent resin 15.

In the examples described in FIGS. 1A, 1B, the phosphor containing resin layer 16 is composed of a first region 16a and a second region 16b different in the fluorescent colors. For example, the light emitting element 11 is provided with a violet light emitting element, the first region 16a including a warm colored phosphor such as green, orange, and red, and the second region 16b including a cool colored phosphor such as blue. Reddish white light is extracted from the first region 16a and bluish white light is extracted from the second region 16b. For example, the color temperature of the reddish white light is 2800K and the color temperature of the bluish white light is 6500K.

As the phosphor containing resin layer 16 includes the warm colored phosphor and the cool colored phosphor, the light emitting device 1 can emit the white light that mixes the reddish white light and the bluish white light and is near to sunlight. As the phosphor containing resin layer 16 is divided into the region including the warm colored phosphor and the region including the cool colored phosphor, the light emitting device 1 can prevent cool colored fluorescence having a short wavelength from reabsorbing in the warm colored phosphor.

Figure 2A:
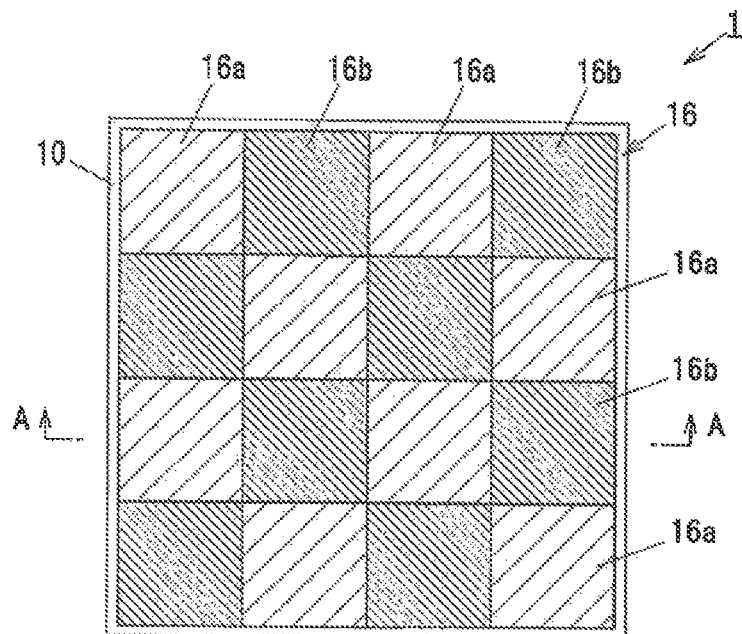
FIG. 2A is a top view showing the light emitting device according to the embodiment.
Figure 2B:
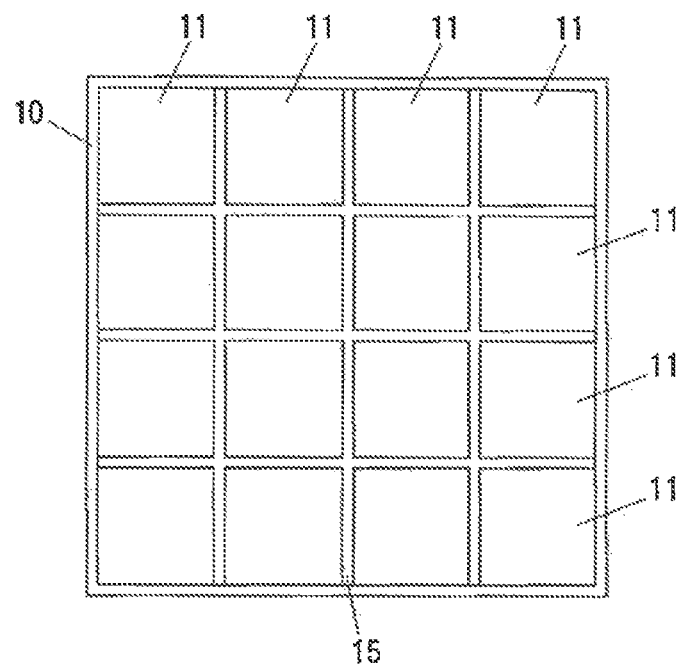
FIG. 2B is a top view showing the light emitting device before forming a phosphor containing resin layer.

FIG. 2A is a top view showing the light emitting device 1. FIG. 2A shows an arrangement example of the first region 16a and the second region 16b while the phosphor containing resin layer 16 is composed of the first region 16a and the second region 16b. FIG. 2B is a top view showing the light emitting device 1 before forming the phosphor containing resin layer 16. The cross section shown in FIG. 1A corresponds to a cross sectional view cut along the line A-A in FIG. 2A.

In the example shown in FIG. 2A, the first region 16a and the second region 16b are distributed in a lattice pattern so as to form a checkered pattern, that is, so as to locate alternately along the longitudinal direction and the horizontal direction. Thus, it is easy to mix the light emitted from the first region 16a and the light emitted from the second region 16b, and the color unevenness is controlled.

As shown in FIGS. 2A, 2B, one light emitting element 11 is applied per one first region 16a or one second region 16b, and the center of the first region 16a or the second region 16b substantially corresponds to the center of the light emitting element 11 in the surface direction. For example, the size of the first region 16a and the second region 16b is 1.05×1.05 mm while the size of the light emitting element 11 is 1×1 mm.

Method of Manufacturing Light Emitting Element

FIGS. 3A to 3D are longitudinal sectional views showing a manufacturing process of the light emitting device 1 according to the embodiment.

Figure 3A:
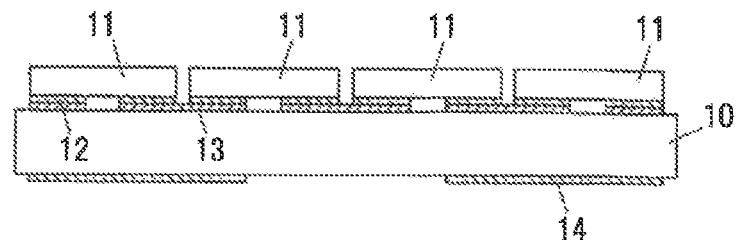
FIG. 3A is a longitudinal sectional view showing a manufacturing process of the light emitting device according to the embodiment.

Firstly, as shown in FIG. 3A, the substrate 10 on which the plurality of light emitting elements 11 is disposed is prepared.

Figure 3B:
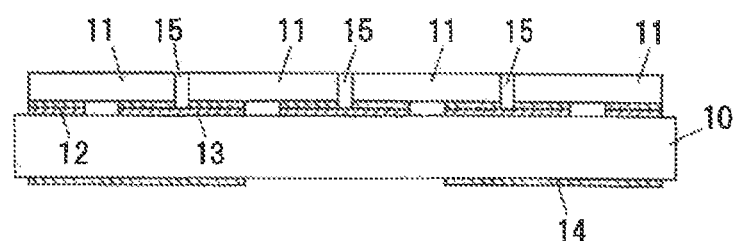
FIG. 3B is a longitudinal sectional view showing the manufacturing process of the light emitting device according to the embodiment.

Next, as shown in FIG. 3B, the transparent resin 15 is embedded in the space between the plurality of light emitting elements 11.

For example, the transparent resin 15 is formed by screen printing. In this case, the transparent resin 15 can be embedded certainly in the space between the plurality of light emitting elements 11 by screen printing by using a mask of which opening width is narrower than the width of the space W between the light emitting elements 11. For example, the mask having the opening width in about 30 µm can be applied when the width W is 50 µm. Meanwhile, other method such as potting may be used in embedding the transparent resin 15.

Figure 3C:
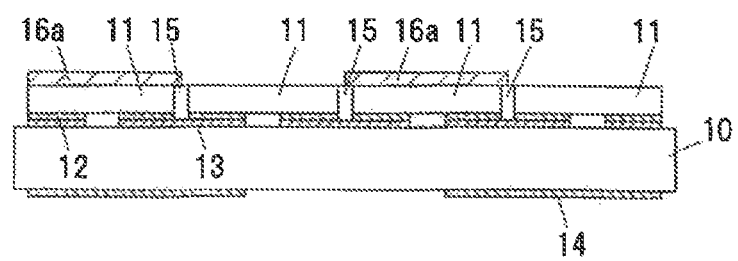
FIG. 3C is a longitudinal sectional view showing the manufacturing process of the light emitting device according to the embodiment.

Next, as shown in FIG. 3C, the first region 16a in the phosphor containing resin layer 16 is formed.

Figure 3D:
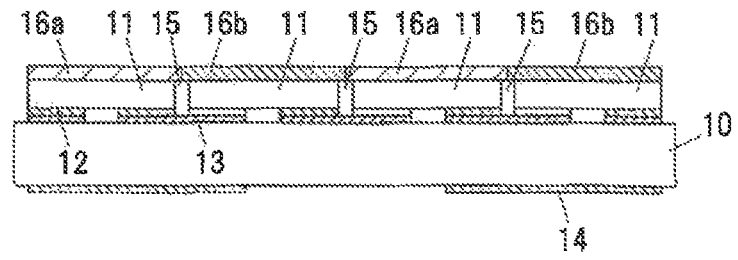
FIG. 3D is a longitudinal sectional view showing the manufacturing process of the light emitting device according to the embodiment.

Next, as shown in FIG. 3D, the second region 16b in the phosphor containing resin layer 16 is formed.

For example, the first region 16a and the second region 16b in the phosphor containing resin layer 16 are formed by screen printing. Each of the first region 16a and the second region 16b may be formed firstly.

Figure 4A:
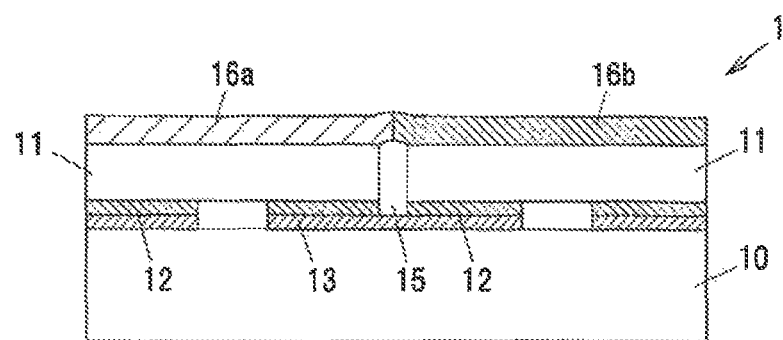
FIG. 4A is a longitudinal sectional view showing a modification of the light emitting device according to the embodiment.
Figure 4B:
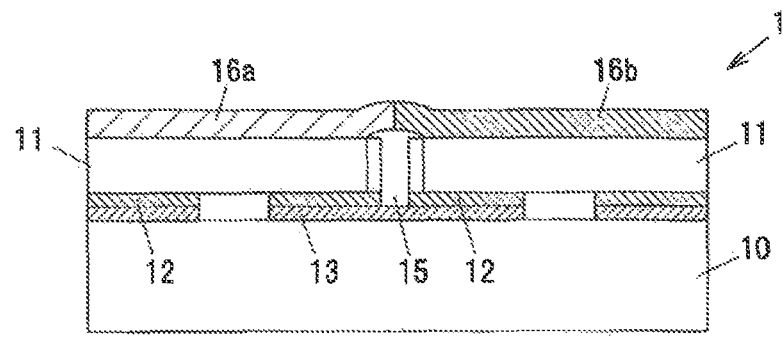
FIG. 4B is a longitudinal sectional view showing the modification of the light emitting device according to the embodiment.

FIGS. 4A, 4B are longitudinal sectional views showing a modification of the light emitting device 1 having a configuration that a top position of the transparent resin 15 is higher than a top surface of the plurality of light emitting elements 11.

If the border of the plural types of regions of the phosphor containing resin layer 16 different in the fluorescent colors is located on the transparent resin 15, an expansion of the phosphor containing resin layer 16 where is firstly formed before resin hardening in a planar direction can be prevented by the top position of the transparent resin 15 higher than the top surface of the plurality of light emitting elements 11.

Specifically, for example, the first region 16a of the phosphor containing resin layer 16 can be prevented from spreading to a region where the second region 16b is formed in the process shown in FIG. 3C.

As shown in FIG. 4B, it is preferable to inject the transparent resin 15 into the space between the light emitting elements 11 until part of the transparent resin is stranded on the edge of upper surface of the light emitting element 11 such that the top position of the transparent resin 15 is substantially higher than the top surface of the plurality of light emitting elements 11.

Advantageous Effects of Invention

According to the above embodiment, the light emitting device having less color unevenness can be obtained by embedding the transparent resin that fails to include the phosphor in the space between the light emitting elements even if the plurality of light emitting elements is disposed with the high density.

Although the embodiments have been described, the invention is not intended to be limited to the embodiments. The various kinds of modifications can be implemented without departing from the gist of the invention. For example, the light emitting elements may be divided by forming a scribing line by cutting.

Also, the claimed invention is not intended to be limited to the embodiments. Further, it should be noted that all combinations of the features described in the embodiments and the Examples are not necessary to solve the problems of the invention.

What is claimed is:

1. A light emitting device, comprising:
   a substrate;
   a plurality of light emitting elements disposed on the substrate;
   a transparent resin embedded only in a space between the plurality of light emitting elements; and
   a phosphor containing resin layer formed on the plurality of light emitting elements and the transparent resin,
   wherein the transparent resin includes no phosphor,
   wherein the phosphor containing resin layer comprises a plurality of regions comprising different kinds of phosphors,
   wherein each one of the plurality of regions is disposed on each one of the plurality of light emitting elements,
   wherein the plurality of light emitting elements are disposed on the substrate in a stacking direction of the phosphor containing resin layer on the plurality of light emitting elements, and
   wherein, in the stacking direction, a bottom surface of the phosphor containing resin layer and a border of the plurality of regions of the phosphor containing resin layer are disposed on a top surface of the transparent resin.

2. The light emitting device according to claim 1, wherein the plurality of regions are different in fluorescent color.

3. The light emitting device according to claim 2, wherein the phosphor containing resin layer comprises a first region and a second region different in fluorescent color, and
   wherein the first region and the second region are distributed in a form of a checkered pattern.

4. The light emitting device according to claim 2, wherein border of the plurality of regions of the phosphor containing resin layer is located on the transparent resin.

5. The light emitting device according to claim 4, wherein a top position of the transparent resin is higher than a top surface of the plurality of light emitting elements.

6. A method of manufacturing a light emitting device, the method comprising:

embedding a transparent resin only in a space between a plurality of light emitting elements disposed on a substrate; and forming a phosphor containing resin layer on the plurality of light emitting elements and the transparent resin, wherein the transparent resin includes no phosphor, wherein the phosphor containing resin layer comprises a plurality of regions comprising different kinds of phosphors, wherein each one of the plurality of regions is disposed on each one of the plurality of light emitting elements, wherein the plurality of light emitting elements are disposed on the substrate in a stacking direction of the phosphor containing resin layer on the plurality of light emitting elements, and wherein, in the stacking direction, a bottom surface of the phosphor containing resin layer and on a border of the plurality of regions of the phosphor containing resin layer are disposed on a top surface of the transparent resin.

7. The method according to claim 6, wherein the plurality of regions are different in fluorescent color.

8. The method according to claim 7, wherein the phosphor containing resin layer is formed such that the border of the plurality of regions with a different fluorescent color is located on the transparent resin.

9. The method according to claim 8, wherein the transparent resin is formed such that a top position of the transparent resin is higher than a top surface of the plurality of light emitting elements.

10. The method according to claim 6, wherein the transparent resin and the phosphor containing resin layer are formed by screen printing.

11. The light emitting device according to claim 1, wherein an uppermost surface of the transparent resin abuts the bottom surface of the phosphor containing resin layer.

12. The light emitting device according to claim 1, wherein the phosphor containing resin layer comprises:
a first region disposed above a first light emitting element of the light emitting elements; and
a second region disposed above a second light emitting element of the light emitting elements, the second region having a different fluorescent color from the first region.

13. The light emitting device according to claim 12, wherein the first light emitting element is located adjacent to the second light emitting element.

14. The light emitting device according to claim 13, wherein the first region contacts the second region in an area of the phosphor containing resin layer that is located on an upper surface of the transparent resin.

15. The method according to claim 6, wherein an uppermost surface of the transparent resin abuts the bottom surface of the phosphor containing resin layer.

16. The method according to claim 6, wherein the phosphor containing resin layer comprises:
a first region disposed above a first emitting element of the light emitting elements; and
a second region disposed above a second light emitting element of the light emitting elements, the second region having a different fluorescent color from the first region.

17. The method according to claim 16, wherein the first light emitting element is located adjacent to the second light emitting element.

18. The method according to claim 17, wherein the first region contacts the second region in an area of the phosphor containing resin layer that is located on an upper surface of the transparent resin.

* * * * *